United States Patent
Berger et al.

(10) Patent No.: US 8,354,642 B2
(45) Date of Patent: Jan. 15, 2013

(54) MONOLITHIC PASSIVE THZ DETECTOR WITH ENERGY CONCENTRATION ON SUB-PIXEL SUSPENDED MEMS THERMAL SENSOR

(75) Inventors: Israel Berger, Haifa (IL); Danny Elad, Liman (IL); David Goren, Nesher (IL); Thomas Erwin Morf, Gross (CH)

(73) Assignee: International Business Machines Corporation, Armonk, NY (US)

( * ) Notice: Subject to any disclaimer, the term of this patent is extended or adjusted under 35 U.S.C. 154(b) by 126 days.

(21) Appl. No.: 12/903,235

(22) Filed: Oct. 13, 2010

(65) Prior Publication Data

US 2012/0091342 A1   Apr. 19, 2012

(51) Int. Cl.
*H01L 27/14* (2006.01)
(52) U.S. Cl. .................. 250/338.4; 250/338.1
(58) Field of Classification Search ............... 250/338.4
See application file for complete search history.

(56) References Cited

U.S. PATENT DOCUMENTS

| | | | |
|---|---|---|---|
| 6,329,655 B1* | 12/2001 | Jack et al. | 250/338.1 |
| 7,253,412 B2 | 8/2007 | Bluzer | |
| 7,501,626 B2 | 3/2009 | Wood et al. | |
| 2006/0231761 A1* | 10/2006 | Peytavit et al. | 250/338.1 |
| 2007/0278407 A1* | 12/2007 | Wood et al. | 250/341.1 |
| 2009/0114822 A1 | 5/2009 | Cox et al. | |
| 2010/0184245 A1* | 7/2010 | Ouvrier-Buffet et al. | 438/59 |
| 2011/0062333 A1* | 3/2011 | Ben-Bassat | 250/332 |
| 2011/0062334 A1* | 3/2011 | Ben-Bassat | 250/332 |

OTHER PUBLICATIONS

Peytavit et al., Room Temperature Terahertz Microbolometers, Infrared and Millimeter Waves and 13th International Conference on Terahertz Electronics, 2005. IRMMW-THz 2005. The Joint 30th International Conference on Williamsburg, VA, USA Sep. 19-23, 2005, IEEE, vol. 1, Sep. 19, 2005, pp. 257-258.*

L. Gitelman, "CMOS-SOI-MEMS Transistor for Uncooled IR Imaging", IEEE, 2009.

Cox, J. Allen et al., "Uncooled MEMS-Based Detector Arrays for THz Imaging Applications", Terahertz Physics, Devices, and Systems III: Advanced Applications in Industry and Defense, Apr. 14, 2009-Apr. 15, 2009; Publisher: SPIE.

* cited by examiner

*Primary Examiner* — Marcus Taningco
(74) *Attorney, Agent, or Firm* — Zaretsky Howard; Woods Oviatt Gilman LLP (57) ABSTRACT

A THz radiation detector comprising a plurality of antenna arms separated from a suspended platform by an isolating thermal air gap. The detector functions to concentrate THz radiation energy into the smaller suspended MEMS platform (e.g., membrane) upon which a thermal sensor element is located. The THz photon energy is converted into electrical energy by means of a pixilated antenna using capacitive coupling in order to couple this focused energy across the thermally isolated air gap and onto the suspended membrane on which the thermal sensor is located.

23 Claims, 7 Drawing Sheets

MONOLITHIC PASSIVE THZ DETECTOR WITH ENERGY CONCENTRATION ON SUB-PIXEL SUSPENDED MEMS THERMAL SENSOR

FIELD OF THE INVENTION

The present invention relates to the field of semiconductor imaging devices, and more particularly relates to a monolithic passive THz detector having energy concentration on a sub-pixel suspended Microelectromechanical systems (MEMS) based platform.

SUMMARY OF THE INVENTION

A THz radiation detector comprising a plurality of antenna arms separated from a suspended platform by an isolating thermal air gap. The detector functions to concentrate THz radiation energy into the smaller suspended MEMS platform (e.g., membrane) upon which a thermal sensor element is located. The THz photon energy is converted into electrical energy by means of a pixilated antenna using capacitive coupling in order to couple this focused energy across the thermally isolated air gap and onto the suspended membrane on which the thermal sensor is located.

The detector mechanism achieves a much stronger, focused THz induced thermal heating of the suspended membrane such that this thermal signal becomes much stronger than the detector temperature noise, even when the detector operates at room temperature. This much higher thermal signal to thermal noise is then converted into a much higher electrical signal to electrical noise by the thermal sensor element.

There is thus provided in accordance with the invention, a terahertz (THz) detector comprising a dielectric substrate, an antenna fabricated on the substrate, a suspended platform comprising a thermal sensor operative to receive THz radiation focused by the antenna via capacitive coupling and operative to convert the received THz radiation to an electrical signal and wherein the capacitive coupling provides thermal isolation between the antenna and the thermal sensor.

There is also provided in accordance with the invention, a terahertz (THz) detector comprising a dielectric substrate, an antenna fabricated on the substrate and operative to receive THz radiation, a load resistor capacitively coupled to the antenna and a suspended platform comprising a thermal sensor thermally isolated from the antenna and thermally coupled to the resistor and operative to convert THz radiation focused by the antenna to an electrical signal.

There is further provided in accordance with the invention, a method of detecting terahertz (THz) radiation, the method comprising providing an antenna fabricated on a dielectric substrate and operative to receive THz radiation energy, capacitively coupling THz radiation energy received by the antenna to a resistor, thermally coupling heat generated by the resistor to a suspended platform comprising a thermal sensor thermally isolated from the antenna and thermally coupled to the resistor and converting THz radiation incident on the thermal sensor to an electrical signal.

BRIEF DESCRIPTION OF THE DRAWINGS

The invention is herein described, by way of example only, with reference to the accompanying drawings, wherein.

DETAILED DESCRIPTION OF THE INVENTION

THz radiation imaging is currently an exponentially developing research area with inherent applications such as THz security imaging which can reveal weapons hidden behind clothing from distances of ten meters or more; or medical THz imaging which can reveal, for example, skin cancer tumors hidden behind the skin and perform fully safe dental imaging. Constructing prior art THz detectors is typically a challenging endeavor since both radiation sources and radiation detectors are complex, difficult and expensive to make.

THz radiation is non-ionizing and is therefore fully safe to humans unlike X-ray radiation. THz imaging for security applications, for example, uses passive imaging technology, namely the capabilities of remote THz imaging without using any THz radiation source thus relying solely on the very low power natural THz radiation which is normally emitted from any room temperature body according to well-known black body radiation physics. Passive THz imaging requires extremely sensitive sensors for remote imaging of this very low power radiation. Prior art passive THz imaging utilizes a hybrid technology of superconductor single detectors cooled to a temperature of about 4 degrees Kelvin which leads to extremely complex (e.g., only the tuning of the temperature takes more than 12 hours before any imaging can take place) and expensive (e.g., $100,000 or more) systems. A detector is desirable that can be used to detect THz radiation and that has much lower potential cost compared with existing superconducting solutions. Passive THz imaging, however, requires three orders of magnitude higher sensitivity compared with passive infrared (IR) imaging, which is a challenging gap.

Figure 1:
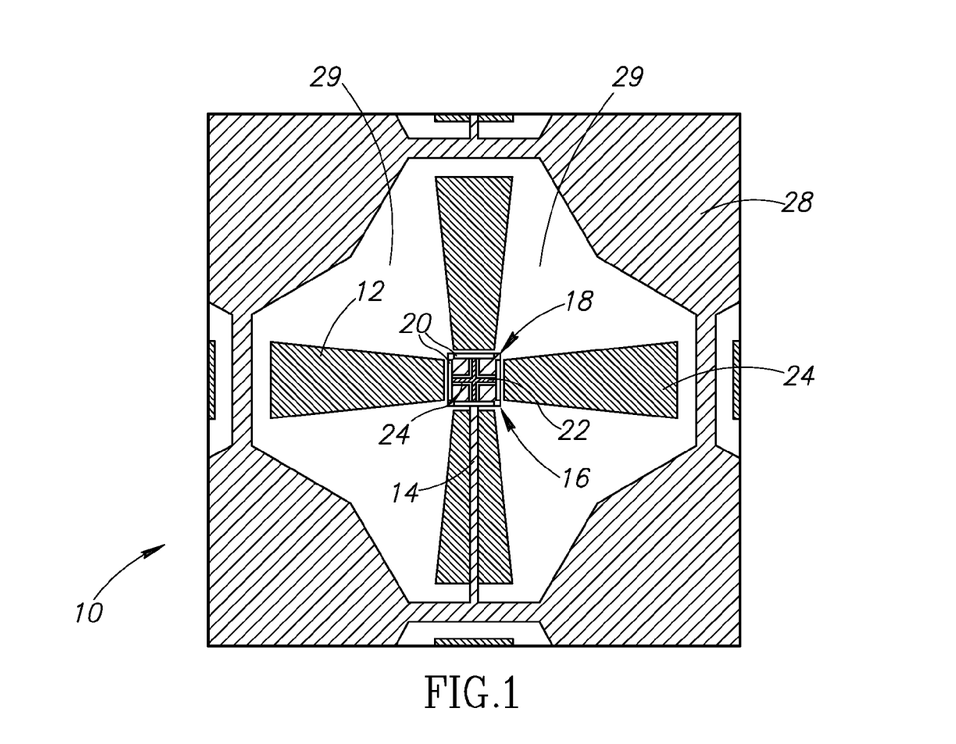
FIG. 1 is a diagram illustrating an example embodiment of a passive THz radiation detector.

A diagram illustrating an example embodiment of a passive THz radiation detector is shown in FIG. 1. The THz radiation detector embodiment, generally referenced 10, comprises antenna bars 12, capacitive coupling gaps 18, suspended platform 16, resister 22, thermal sensing element 24, holding arm 14 and substrate 28. The etched areas denoted 29 provide isolation to other surrounding detectors.

The THz detector 10 utilizes an electromagnetic coupling technique whereby the optical energy (i.e. THz energy) is first absorbed by the antenna 12 (which in this specific example comprises a cross dipole bow-tie type antenna) which functions to convert it to electrical energy that is then capacitively coupled to the thermally isolated, released thermal sensor element (e.g., a diode, transistor, etc.). Capacitively coupling the antenna to the thermal sensor element provides thermal isolation of the sensor from the antenna.

In one example embodiment, a plurality of detectors are arranged to receive THz radiation energy in a 2D array configuration. In this case, THz radiation energy received in each pixel of the 2D imaging array, whose size, in one example embodiment, is on the order of several hundred microns (e.g., 300 microns square) and concentrated at each pixel at a frequency on the order of 1 THz into a much smaller suspended MEMS platform (of the order of tens microns) on which the THz detector is situated (so that the complete suspended thermally isolated MEMS structure has minimal thermal mass and thermal conductivity). As mentioned hereinabove, this is achieved by means of converting the THz photon energy into electrical energy using a pixilated antenna and by using capacitive coupling to couple this focused antenna energy across the thermally isolated air gap and into the suspended platform on which the thermal sensor is located. This method achieves focused THz induced thermal heating of the suspended platform so that this THz induced thermal signal becomes much stronger than the detector temperature noise, even when the detector operates at room temperature. This higher thermal signal to thermal noise is then converted into a signal having a larger electrical signal to noise ratio by the sensing active device (e.g., transistor). In other words, a thermal conductance discontinuity (e.g., capacitance coupling gap 18) is created between the antenna and the relatively small suspended platform by means of the MEMS process.

Figure 10:
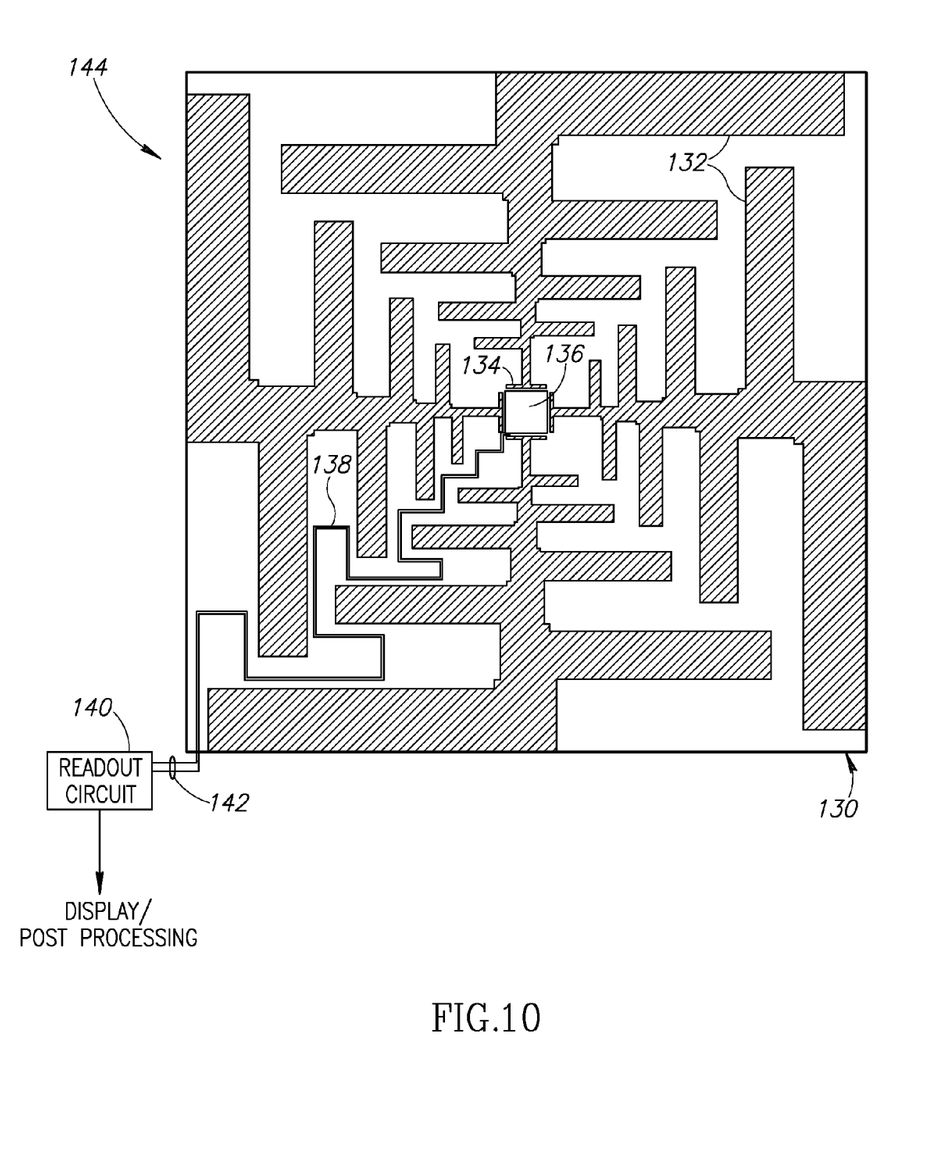
FIG. 10 is a diagram illustrating a second example embodiment of a passive THz radiation detector.

The technique of using capacitive coupling to focus the antenna energy onto an isolated sub-pixel floating platform 16 can be used with a variety of on-chip pixilated antennas, such as the antenna shown in FIG. 10 which has higher bandwidth. Focusing the THz energy via the antenna 12 aids in filtering out competing received infrared radiation, since the infrared radiation not being received by the antenna is absorbed by the small suspended platform 16 whose size is substantially smaller than the pixel size. Note that the capacitive coupling can be increased by combining several silicon process back end of line (BEOL) metal levels to form the capacitors and by using interdigitized (i.e. comb like) structures to increase the capacitor area.

In addition, the detector provides impedance matching between the pixilated antenna 12 and the thermal sensor across the coupling capacitance. An antenna with reactive impedance is preferably used that cancels the coupling capacitance at the bandwidth of interest. This can be achieved, for example, by using the bow-tie dipole antenna 12 whose length is larger than half a wavelength and is also possible by an appropriate design of the antenna shown in FIG. 10. The higher than half wavelength antenna also provides a high impedance of several hundred ohms which aids in matching the antenna to the thermal sensor element across the given impedance of the coupling capacitor.

The impedance matching between the antenna and the thermal sensor element is achieved by capacitively coupling the signal into a matched resister, preferably made of polysilicon. Note that it is preferable to use a cross shaped resistor made of polysilicon mated with a standard NMOS transistor located in the vicinity of the resistor. Note that in an alternative embodiment, this approach is modified to permit separating the two different polarizations of the received THz radiation. This can be useful to identify polarized radiation such as obtained from reflection by flat surfaces.

The cross bow-tie type antenna shown in FIG. 1 comprises two orthogonal bow-tie antennas 12 whose shape and length are designed to form a bit reactive impedance over the desired THz imaging spectrum. The energy from the antennas is then capacitively coupled to the sub-pixel suspended platform 16 which remains after the etching process. Optionally, stronger capacitive coupling can be achieved by using several BEOL metal layers of the silicon process connected by dense vias at the edge of the antenna and the platform (not shown).

It is noted that the platform 16 comprises a suspended, thermally isolated platform with the thermal sensing element (e.g., transistor, diode, etc.) located on it. The platform is designed with dimensions typical for existing infra-red detectors. The platform is connected to the silicon substrate 28 by a holding arm 14. The holding arm defines the thermal resistance which, together with the platform thermal capacitance, tunes the platform to have the desired thermal time constant appropriate for video imaging (i.e. about 70 milliseconds or less).

It is appreciated that the detector shown in FIG. 1 is one example embodiment whereby the thermal flow discontinuity between the antenna and the tiny platform is enabled by the MEMS process. For example, the detector of FIG. 1 illustrates the option of having the holding arm run inside one of the bow-tie trapezoids. It is appreciated that other arrangements are possible as well, such as to have the holding arm run diagonally outside of the antenna. Alternatively, the holding arm may go in a big circle around the antenna until it reaches the silicon substrate, which results in much lower thermal conductance of the holding arm.

Other possible antenna types include spiral antennas, toothed antennas and slotted antennas. Although it is not critical which antenna type is used, it is preferred that the energy from the antenna is not directly coupled to the detector but rather is capacitively coupled to permit thermal isolation of the thermal sensor element.

The capacitance coupling between the suspended, thermally isolated, platform and the antenna arms can be significantly increased if the length over which they are made parallel to each other is increased. To achieve this, the coupling capacitor located on the platform edges can be constructed with a saw-tooth (i.e. comb like) edge structure, and the antenna bar shape is adapted to have a complimentary saw-tooth edge structure, such that the structure becomes an interdigitized capacitor structure. This adds significantly to the coupling surface between the coupling capacitor and the antenna, without adding much to the capacitor area (i.e. without adding to the coupling capacitor's thermal capacitance). The same technique can be used if several BEOL metal levels are used to form the coupling capacitor. The same coupling capacitance can be increased by making the parallel spacing between the antenna and the platform smaller. This, however, depends on the quality of the MEMS process being used. A better MEMS process allows this spacing to decrease without the risk of having an electrical short between the antenna and the coupling capacitance metals in the platform.

Figure 2:
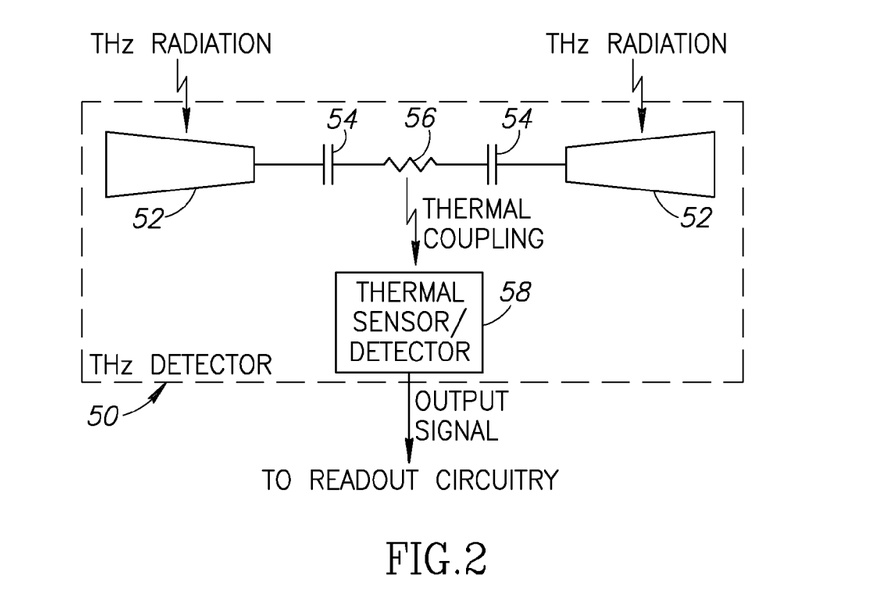
FIG. 2 is a circuit diagram illustrating an equivalent circuit for the THz radiation detector of FIG. 1.

A circuit diagram illustrating an equivalent circuit for the THz radiation detector of FIG. 1 is shown in FIG. 2. The detector, generally referenced 50, comprises a plurality of antenna bars 52 (e.g., cross dipole bow-tie type antenna), coupling capacitors 54, heating element (e.g., resistor) 56 and thermal sensor 58 thermally coupled to resistor 56.

In one embodiment, the resistor comprises a polysilicon resistor and the thermal sensor element comprises an SOI transistor which is located on the suspended platform 16 (FIG. 1). In one embodiment, the areas designated 24 comprise the diffusion regions of this transistor. In another embodiment the size of the transistor is made relatively small is located at one corner between the cross shaped polysilicon wires.

The portion referenced 28 comprises the supporting silicon wafer substrate. In one embodiment, the bow-tie antenna resides directly on the silicon wafer as is where the MEMS post-processing is only used to release the small suspended platform both from below and from above. Due to the high dielectric constant and associated losses of the silicon, however, some undesired THz energy reflection may occur close to the antenna. In order to prevent this, in an alternative embodiment, the silicon wafer is back etched from below the antenna to form the large openings using Deep Reactive Ion Etch (DRIE) etching wherein the buried oxide layer (BOX) of the SOI silicon process is used as an etch-stop. The bow-tie antenna bars thus preferably are constructed within a pure silicon oxide area without any silicon below them. The antenna is then still within the same oxide and buried oxide layers which are not separated from the surrounding silicon wafer. Note that in one embodiment, the entire region below the two dimensional array of active pixels is etched using well-known deep reactive-ion etching (DRIE) techniques.

Reactive Ion Etching (RIE) is them applied from the front side to fully release only the suspended platform 16 and its holding arm 14. The existing silicon process BEOL metal layers are used as RIE etch masks.

When forming a 2D array of pixels such as shown in FIG. 1, e.g., antenna capacitively coupled thermally isolated bolometer, it is desirable to decrease the electrical crosstalk between the pixels. In one embodiment, this can be achieved by rotating each pixel antenna 45 degrees with respect to the neighboring antennas of adjacent pixels thereby forming a chess like array in which the cross shaped antennas are either straight or tilted by 45 degrees. This chess like structure has another benefit in the sense that it provides more room to construct the antenna arms a bit longer which helps to be more flexible and provide the desired large and reactive impedance over the desired THz frequency bandwidth. Note that the same technique can be used for the high bandwidth reflector previously described, i.e. the reflector metallic cross shapes can be rotated to form the same chess like 2D array structure in which the cross shapes are either straight or tilted by 45 degrees.

To further improve both the sensitivity and the spectral selectivity of the THz detector, a high bandwidth backside reflector plane is added to the pixilated antennas wafer. This backside reflector is on a second plate, parallel to the THz detector chip and separated by a particular distance from its back side using a dedicated spacer. If a back metallic surface is placed with a given separation distance from the antenna, it functions as an effective reflector at the one frequency in which the separation distance equals a quarter of the corresponding wavelength (calculated in the dielectric medium between the antenna and the reflecting metal plane). This is sufficient if it is desired to have a good narrowband reflector at a given frequency. For high bandwidth applications (i.e. frequency ratio about 1:1.5 or even greater than 1:2 or 1:3), however, an efficient reflector throughout this whole bandwidth is required.

Figure 3:
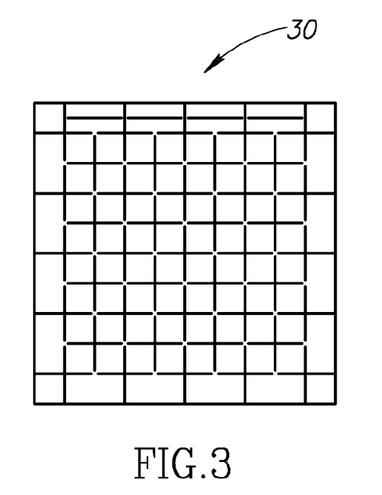
FIG. 3 is a diagram illustrating a metal pattern layer of a wide bandwidth reflector structure of the detector.

In order to attain this high bandwidth a back reflector comprising several metallic layers is constructed, each patterned as an array of metal cross shapes as shown in FIG. 3, wherein all layers are constructed within the same background dielectric constant of the packaging material. FIG. 3 illustrates a top down view of a single metal patterned layer of the high bandwidth reflector structure.

Figure 4:
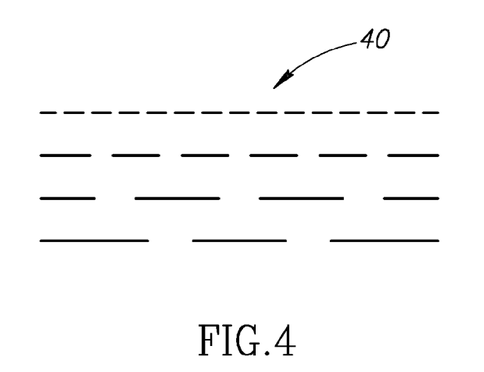
FIG. 4 is a diagram illustrating several layers of the wide bandwidth reflector structure of the detector.

Such a 2D ordered array of cross shapes functions as a filter reflecting back radiation whose half wavelength is smaller than the cross bar length, and permitting radiation with longer wavelengths to pass through. This is similar to the shapes used in a Yagi-Uda antenna. Any rod element of a Yagi-Uda antenna can operate as a reflector or a director depending on its length relative to the half wavelength length of the dipole antenna element itself. The back reflector of a Yagi-Uda antenna is therefore somewhat longer than half a wavelength, and the front directors are shorter than half a wavelength. In one embodiment of the detector of the present invention, a plurality of parallel layers of the type patterned as in FIG. 3 are combined to form a stack of layers as shown in FIG. 4 wherein the cross arm lengths become longer as we move to layers further from the pixilated antennas wafer plane.

Each of these patterned layers has a separation distance from the pixilated antenna plane which is equal to a quarter of a wavelength where the cross arm length in this same patterned layer is adapted to be somewhat longer than half the same wavelength. This rule of thumb serves as a guideline for the tuning and optimization of this structure within an electromagnetic (EM) solver analysis application, after which the patterned layer design is somewhat amended to consider the existing interaction between the elements of different lengths.

It is recommended to implement this layered structure within any high quality dielectric material such as multilayered alumina packaging technology. Although attention to the quality of the dielectric material used at THz frequencies should be given, some losses can be tolerated.

Alternatively, the readout of several pixels is electrically combined together, which yields higher sensitivity (i.e. a higher signal to noise ratio) in the lower THz frequencies but at the cost of reduced resolution in the higher THz frequencies. This technique can be implemented dynamically by fast switching between the two options in time or used with slow switching between two image options. Since the video rate used has a relatively low frame rate of about 15 Hz (in order to have the largest possible integration time in each sensing device to achieve the largest possible signal to noise ratio) the available "dead" time between frames can be used to alternatively display both the image with a small pixel size (i.e. higher resolution) and the image with a large pixel size (i.e. higher sensitivity and higher penetration through clothing). Both images are combined in the eye of the user viewing the image to create a higher quality image having both high resolution and high penetration/sensitivity. This can be achieved without increasing the actual detector sampling rate, and thus not adding any noise. This same technique can be used to form a continuous function between the two extremes of small and large pixel size, by displaying many image frames during the sensor integration time, where some images have small pixels and some of them have the combined larger pixels. By varying the ratio of image frames shown with the larger pixels, one can sweep through the trade off between resolution and sensitivity/penetration by moving or rotating a knob in the camera or other image detection device.

Figure 5:
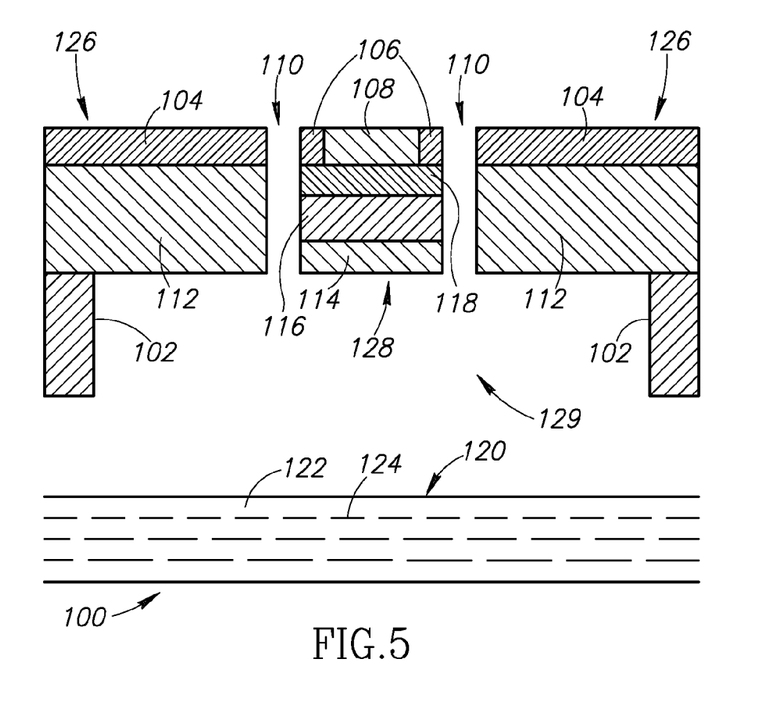
FIG. 5 is a diagram illustrating a side view of the THz radiation detector of FIG. 1.

A diagram illustrating a side view of the THz radiation detector of FIG. 1 is shown in FIG. 5. The detector, generally referenced 100, comprises bow-tie antenna bars 126, suspended platform 128, silicon substrate 102 and reflector 120. The bow-tie (or any other type) antenna bars 126 are constructed on the silicon substrate 102 and comprise metal 104 (e.g., aluminum or copper) over silicon oxide dielectric (BOX) 112. The suspended platform 128 structure comprises silicon oxide dielectric layer 114, silicon thermal sensor element (e.g., sensing transistor body or bulk wafer) layer 116, polysilicon layer 118, silicon oxide dielectric (BOX) 108 and metal (e.g., aluminum or copper) 106. The high bandwidth reflector 120 comprises dielectric layer 122 and multiple layers of metal mesh patterns 124. In one embodiment, the opening under the antenna and suspended platform is constructed using the well-known technique of Deep Reactive Ion Etch (DRIE) etching. In accordance with the invention, the suspended platform is separated from the antenna bars by a capacitive coupling gap 110.

Figure 6:
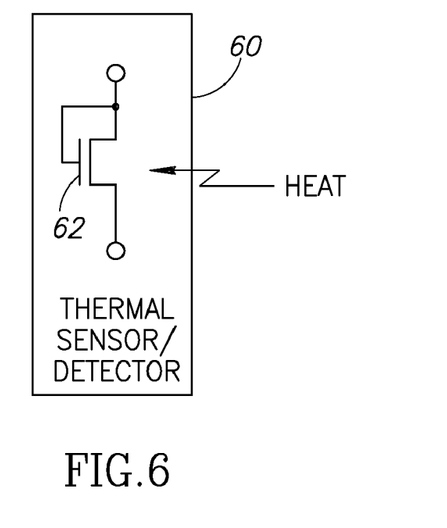
FIG. 6 is a circuit diagram of a first example embodiment of the thermal sensor of the THz detector.

A circuit diagram of a first example embodiment of the thermal sensor of the THz detector is shown in FIG. 6. In this first example embodiment, the thermal sensor element 60 comprises an MOS transistor 62 operating in sub-threshold region. Thermal energy thermally coupled from the resistor 56 (FIG. 2) causes an electrical signal to be generated in the transistor which is then amplified and processed by read-out circuitry.

Figure 7:
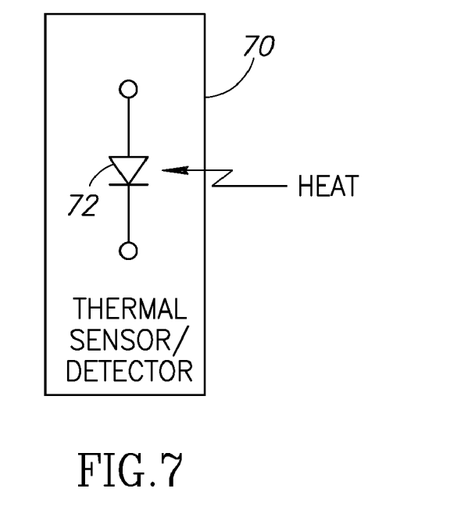
FIG. 7 is a circuit diagram of a second example embodiment of the thermal sensor of the THz detector.

A circuit diagram of a second example embodiment of the thermal sensor of the THz detector is shown in FIG. 7. In this second example embodiment, the thermal sensor element 70 comprises a forward biased diode 72. Thermal energy thermally coupled from the resistor 56 (FIG. 2) causes an electrical signal to be generated in the diode which is then amplified and processed by read-out circuitry.

Figure 8:
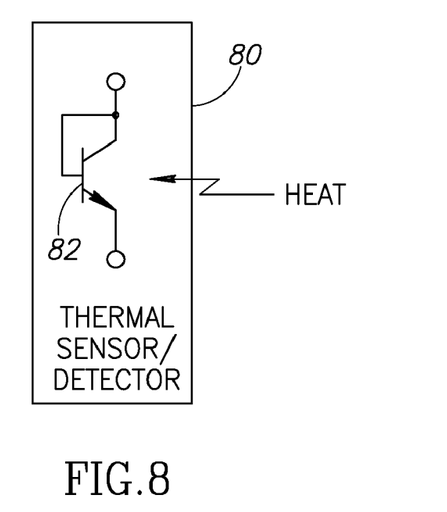
FIG. 8 is a circuit diagram of a third example embodiment of the thermal sensor of the THz detector.

A circuit diagram of a third example embodiment of the thermal sensor of the THz detector is shown in FIG. 8. In this third example embodiment, the thermal sensor element 80 comprises a forward biased bipolar transistor junction 82. Thermal energy thermally coupled from the resistor 56 (FIG. 2) causes an electrical signal to be generated in the bipolar transistor which is then amplified and processed by read-out circuitry.

Figure 9:
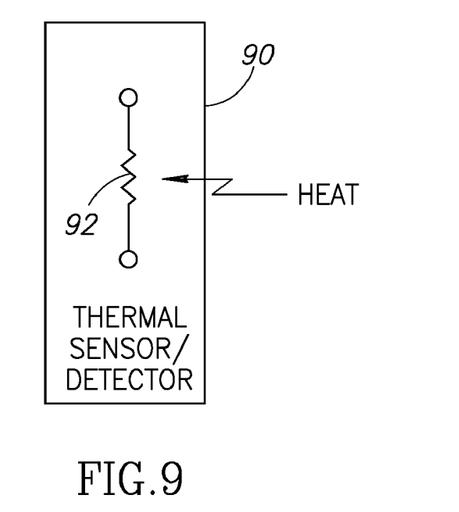
FIG. 9 is a circuit diagram of a fourth example embodiment of the thermal sensor of the THz detector.

A circuit diagram of a fourth example embodiment of the thermal sensor of the THz detector is shown in FIG. 9. In this fourth example embodiment, the thermal sensor element 90 comprises a resistive bolometer 92. Thermal energy thermally coupled from the resistor 56 (FIG. 2) causes an electrical signal to be generated in the bolometer which is then amplified and processed by read-out circuitry.

A diagram illustrating a second example embodiment of a passive THz radiation detector is shown in FIG. 10. The detector shown in FIG. 10 is similar to that of FIG. 1 with the major difference being the type of on-chip antenna used. In FIG. 10, the antenna has a square toothed shape. The detector, generally referenced 130, comprises a plurality of antenna arms 132 (four in this example), silicon substrate 144 surrounding the antenna 130, suspended platform 136, holding arm 138, sensor signals 142 and read-out circuit 140. In operation, antenna protrusions 134, approximately the length of the suspended platform, capacitively couple the thermal energy focused by the antenna to corresponding coupling capacitors (not shown) on the suspended platform across an isolation gap surrounding the suspended platform. The energy coupled across the gap heats a resistor which is sensed by a thermal sensor (not shown) constructed on the suspended platform. The output of the sensor is processed by the read-out circuitry 140 for display or further post-processing.

Figure 11:
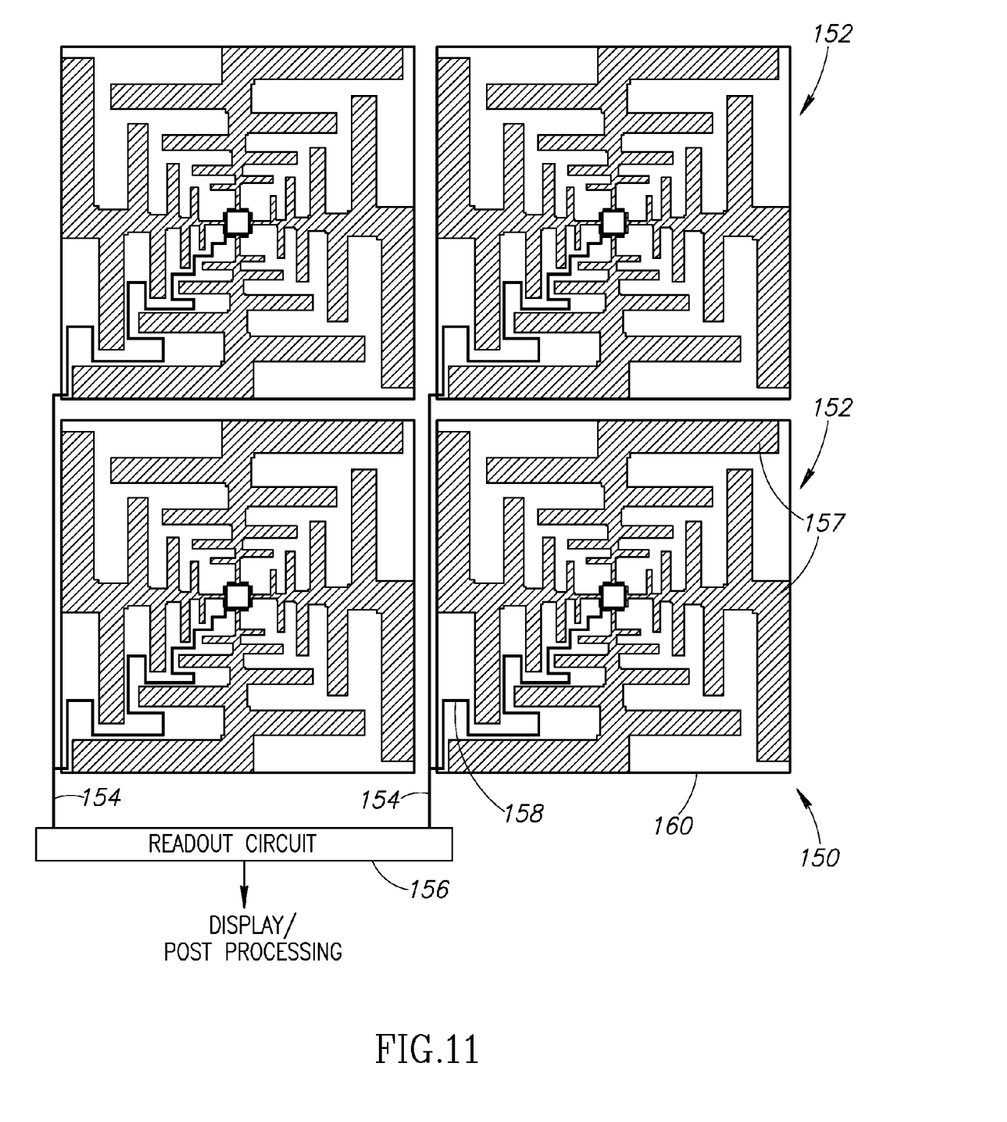
FIG. 11 is a diagram illustrating an example 2×2 pixel matrix using the THz radiation detector of FIG. 10.

A diagram illustrating an illustrative example of a small 2×2 pixel imaging matrix using the THz radiation detector of FIG. 10 is shown in FIG. 11. Note that using the techniques described herein, one skilled in the art can construct much larger matrices of several hundred pixels to create the required high resolution image. The imaging matrix, generally referenced 150, comprises a plurality of detectors 152 (four in this example embodiment), sensor signal lines 154 and read-out circuitry 156. Each detector comprises antenna arms 157, suspended platform 160 and holding arm 158. The output of the sensors located on the platforms is input to the read-out circuit 156 for display or further post-processing. Note that in one embodiment, the pixel array is surrounded by dummy pixel rows and columns. Dummy rows and columns are used to keep the same MEMS and VLSI fabrication conditions for the pixels residing at the periphery of the two dimensional array.

Figure 12:
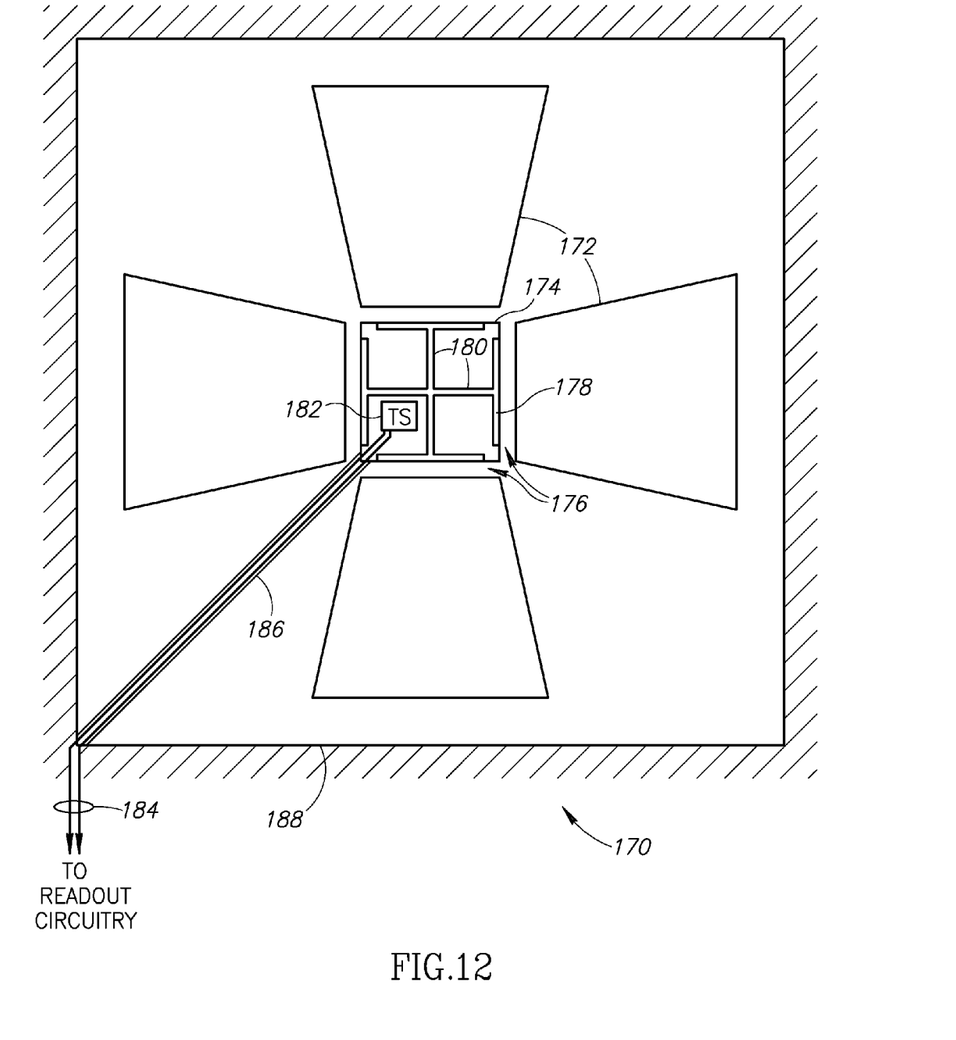
FIG. 12 is a diagram illustrating an expanded view of an example THz detector including holding arm structure and suspended thermal sensor.

A diagram illustrating an expanded view of an example THz detector including holding arm structure and suspended thermal sensor is shown in FIG. 12. The example detector, generally referenced 170, comprises a plurality of antenna bars 172 (four in this example), suspended platform 174 and holding arm 186. The suspended platform 174 comprises coupling capacitors 178 along the four edges of the platform wherein the capacitors are formed from the thermally isolated air gaps 176 surrounding the platform, cross shaped polysilicon resistor 180 which heats the entire platform and thermal sensor 182. Holding arm 186 is attached to the silicon substrate 188 and functions to support the suspended platform. Sensor output signals 184 are routed from the thermal sensor along the holding arm to the read-out circuit (not shown).

Figure 13:
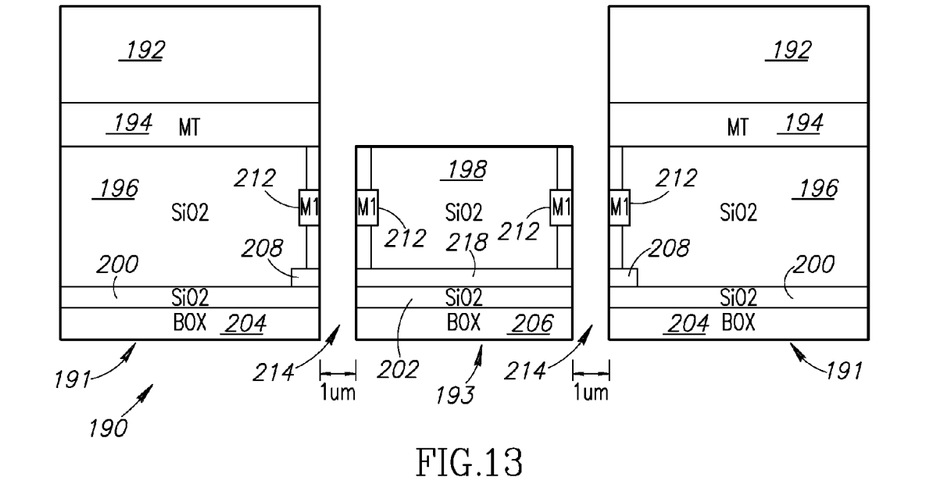
FIG. 13 is a diagram illustrating a side view of the THz radiation detector of FIG. 10.

A diagram illustrating a side view of the THz radiation detector of FIG. 10 is shown in FIG. 13. The detector, generally referenced 190, comprises antenna arms 191 and suspended platform 193. The antenna arms comprise BOX layer 204, silicon dioxide layers 200, 196, polysilicon portion 208, metal portion 212, metal layer 194 and oxide layer 192. The suspended platform comprises BOX layer 206, silicon dioxide layer 202, polysilicon layer 218, silicon dioxide layer 198 and metal portions 212.

Figure 14:
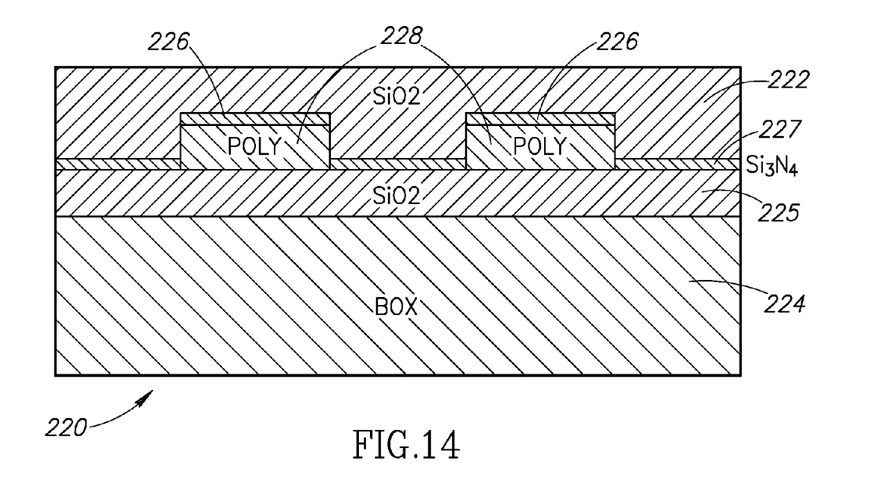
FIG. 14 is a diagram illustrating a side view of the holding arm portion of the THz radiation detector.

A diagram illustrating a side view of the holding arm portion of the THz radiation detector is shown in FIG. 14. The holding arm, generally referenced 220, comprises BOX layer 224, silicon dioxide layer 225, silicon nitride layer 227, polysilicon sensor signal lines 228, silicon nitride layer 226 and silicon dioxide layer 222.

To aid in understanding the operation of the THz detector of the present invention, an example calculation is provided to show quantitatively that room temperature passive THz imaging is a possibility at video rates utilizing the detector.

In this example, a predefined bandwidth of 0.5 to 1.5 THz is assumed, which contains black body power of I=2.857× $10^{-5}$ Watt/cm² at a temperature of 300 Kelvin. The corresponding black body power temperature sensitivity per degree Kelvin is given as $$dI/dT = 1.043 \times 10^{-7} \text{ Watt/cm}^2/^\circ K \quad (1)$$

at T=300K when integrating from 0.5 to 1.5 THz. Let us assume that the overall radiation reception efficiency, considering atmospheric losses, lens losses, emissivity of the target less than one, pixel fill factor, efficiency of the antenna and impedance matching losses, etc. is given as $$\eta_{total} = \eta_{env} \times \eta = 0.3 \quad (2)$$

where $\eta$ is the efficiency of the detector;

$\eta_{env}$ is the efficiency of the environment (i.e. anything other than the detector).

Note that the value of 0.3 is reasonable to assume at this stage. Let us assume that the pixel size is $A_D$=200×200 um² which is the wavelength at the higher end frequency of 1.5 THz and is therefore the best resolution limit which we can achieve at this frequency. Note that in the lower frequencies several pixels are used together to attain higher sensitivity of the unified larger pixel.

Let us assume a frame time of τ=70 msec which corresponds to a video frame rate of 14 Hz, sufficient for the human eye. Higher frame rates are possible but they reduce the signal to noise ratio. Let us further assume that we are using a plastic THz lens with an $F_\#=1$ (i.e. the ratio of the focal length F to the lens diameter D). Alternatively, better optics may be used at the expense of large lens diameters or mirror combinations, etc. For this exemplary calculation, however, we assume simple feasible optics. Let us now assume a noise equivalent temperature difference (NETD) in the target of NETD=0.5° K which is sufficient for high quality thermal imaging.

Assuming the above stated values, the THz signal received by each pixel for a temperature change at the target of ΔT=NETD=0.5 Kelvin is Ps=NEP=1.56 picowatt. Note that this is the received power change per target 0.5 degree change, where the total target power received by each pixel, namely the background power, is approximately $8.57 \times 10^{-10}$ Watt. We calculate this using the well-known equation as follows $$Ps = dI/dT \times \Delta T \times A_D \times \frac{1}{4F_\#^2} \eta_{total} \quad (3)$$

where we replace dI/dT×ΔT by the power density I for the calculation of the background power.

Let us now make the ideal assumption that the main detector noise is the fundamental thermal fluctuation noise due to the finite heat capacity of the platform. This is adequate for an initial start since the thermal fluctuation noise is always left even after we minimize the added electrical noises from the thermal sensor element itself. Assuming this, we can use the known relation for the Noise Equivalent Power (NEP) of the detector due only to the thermal fluctuation noise and equate it to the above calculated signal for reaching a unity signal to noise ratio as follows $$Ps = NEP \times \eta = \sqrt{\frac{kT^2 G_{th}}{\tau}} \quad (4)$$

Assuming that this same received power can be concentrated using capacitive coupling from the receiving antenna into the thermally isolated suspended platform, we obtain the desired threshold signal to noise of unity when the thermal conductivity of the platform is given by:

$$G_{th} = \frac{Ps^2 \tau}{kT^2} \quad (5)$$

which yields a required holding arm thermal conductivity of $1.243 \times 10^{-7}$ Watt/° K assuming a detector temperature of 315 degrees Kelvin (40 degrees Celsius). Note that better results are obtained when the detector is cooled somewhat and maintained, using a closed cycle system, at a fixed temperature somewhat lower than room temperature.

Using the material properties of an example 0.18 um SOI semiconductor process results in a thermal conductivity that corresponds to a suspended platform of 50 micron×50 micron and which has a thermal heat capacity of Cth=$8.70 \times 10^{-9}$ Joule/Kelvin in the sense that they both provide the desired time constant of 70 milliseconds. Following the same calculation, focusing all the energy on a platform smaller than 50 micron by 50 micron, we obtain better performance than this (i.e. a lower NEP) limited by the ability to design and release a small platform, as well by the physical required size of the thermal sensor element (e.g., sensing transistor) which is located on this platform.

Let us now consider the electrical noise processes of the sensor element (e.g., sensing transistor). The expression for the NEP of the detector while also considering the added electrical noises is $$NEP \times \eta = \sqrt{\frac{kT^2 G_{th}}{\tau} + \frac{2q G_{th}^2 B}{TCC^2 I_D} + \frac{K_f G_{th}^2 \ln(f2/f1)}{TCC^2}} \quad (6)$$

These electrical noises, assuming that the transistor is at subthreshold, include two added terms to the NEP expression which are the fundamental shot noise (in the center) and the technology dependent 1/f noise (on the right). In order to lower the relative effect of shot noise we need a sufficiently large threshold detector current $I_D$, e.g., about several 100 nAs. In order to lower the 1/f noise a larger transistor is used which has a higher TCC for the same bias current, and also has a lower $K_f$. It also follows from Equation 6 that if we further reduce the holding arm thermal conductivity, we obtain a significant reduction in the relative impact of these added electrical noises. We can do so by targeting a much smaller platform than 50 micron×50 micron, which can be (in principle) as low as 10 micron×10 micron, thereby reducing the electrical noises by a factor of 625 and the thermal fluctuation noise by a factor of 25.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A terahertz (THz) detector, comprising:
   a dielectric substrate;
   an antenna fabricated on said substrate;
   a suspended platform comprising a thermal sensor operative to receive THz radiation focused by said antenna via capacitive coupling and operative to convert said received THz radiation to an electrical signal;

wherein said capacitive coupling provides thermal isolation between said antenna and said thermal sensor; and wherein said antenna exhibits reactive impedance operative to cancel coupling capacitance at a desired bandwidth.

2. The detector according to claim 1, further comprising a reflector parallel to and separated from said substrate by a predetermined distance, said reflector operative to reflect radiation whose half wavelength is smaller than that of said antenna thereby improving sensitivity and selectivity of said detector.

3. The detector according to claim 2, wherein said reflector comprises a plurality of metallic layers each patterned as an array of metal cross shapes.

4. The detector according to claim 1, wherein said antenna is operative to focus THz induced thermal heating of said suspended thermal sensor such that a resulting thermal signal is significantly greater than thermal sensor temperature noise.

5. The detector according to claim 1, wherein said antenna comprises a cross dipole bow-tie type antenna.

6. The detector according to claim 1, wherein said antenna comprises a square toothed type antenna.

7. The detector according to claim 1, wherein said thermal sensor comprises a pair of independent thermal detectors operative to independently sense two orthogonal polarizations of THz radiation received by said antenna and selected from the group comprising MOS transistors, forward biased diodes, bipolar transistors and a plurality of active devices which together function as a thermal detector.

8. The detector according to claim 1, wherein said antenna focuses THz radiation so as to attenuate and filter out competing received infrared radiation.

9. The detector according to claim 1, wherein said suspended platform is connected and secured to said substrate via a holding arm.

10. The detector according to claim 9, wherein said holding arm is operative to determine the thermal resistance of said suspended platform which functions to tune said suspended platform to have a desired thermal time constant.

11. A terahertz (THz) detector, comprising:
a dielectric substrate;
an antenna fabricated on said substrate and operative to receive THz radiation;
a load resistor capacitively coupled to said antenna;
a suspended platform comprising a thermal sensor thermally isolated from said antenna and thermally coupled to said resistor and operative to convert THz radiation focused by said antenna to an electrical signal; and
wherein said antenna exhibits reactive impedance operative to cancel coupling capacitance at a desired bandwidth.

12. The detector according to claim 11, wherein the resistance of said resistor is configured to match the impedance of said antenna.

13. The detector according to claim 11, further comprising a reflector parallel to and separated from said substrate by a predetermined distance, said reflector operative to reflect radiation whose half wavelength is smaller than that of said antenna thereby improving sensitivity and selectivity of said detector.

14. The detector according to claim 13, wherein said reflector comprises a plurality of metallic layers each patterned as an array of metal cross shapes.

15. The detector according to claim 11, wherein said antenna is operative to focus THz induced thermal heating of said suspended thermal sensor such that a resulting thermal signal is significantly greater than thermal sensor temperature noise.

16. The detector according to claim 11, wherein said antenna comprises a cross dipole bow-tie type antenna.

17. The detector according to claim 11, wherein said thermal sensor comprises a pair of independent thermal detectors operative to independently sense two orthogonal polarizations of THz radiation received by said antenna and selected from the group comprising MOS transistors, forward biased diodes, bipolar transistors and a plurality of active devices which together function as a thermal detector.

18. The detector according to claim 11, wherein said antenna focuses THz radiation so as to attenuate and filter out competing received infrared radiation.

19. The detector according to claim 11, wherein said suspended platform is connected and secured to said substrate via a holding arm.

20. The detector according to claim 19, wherein said holding arm is operative to determine the thermal resistance of said suspended platform which functions to tune said suspended platform to have a desired thermal time constant.

21. A method of detecting terahertz (THz) radiation, the method comprising:
providing an antenna fabricated on a dielectric substrate and operative to receive THz radiation energy;
capacitively coupling THz radiation energy received by said antenna to a resistor;
thermally coupling heat generated by said resistor to a suspended platform comprising a thermal sensor thermally isolated from said antenna and thermally coupled to said resistor;
converting THz radiation incident on said thermal sensor to an electrical signal; and wherein said antenna exhibits reactive impedance operative to cancel coupling capacitance at a desired bandwidth.

22. The method according to claim 21, wherein said suspended platform is connected and secured to said substrate via a holding arm operative to determine the thermal resistance of said suspended platform which functions to tune said suspended platform to have a desired thermal time constant.

23. The method according to claim 21, wherein said thermal sensor comprises a pair of independent thermal detectors operative to independently sense two orthogonal polarizations of THz radiation received by said antenna and selected from the group comprising MOS transistors, forward biased diodes, bipolar transistors and a plurality of active devices which together function as a thermal detector.

* * * * *